United States Patent [19]

Wakui

[11] Patent Number: 5,545,962
[45] Date of Patent: Aug. 13, 1996

[54] POSITIONING SYSTEM

[75] Inventor: Shinji Wakui, Kawasaki, Japan

[73] Assignee: Canon Kabushiki Kaisha, Tokyo, Japan

[21] Appl. No.: 312,932

[22] Filed: Sep. 30, 1994

Related U.S. Application Data

[63] Continuation of Ser. No. 107,613, Aug. 18, 1993, abandoned.

[30]   Foreign Application Priority Data

Aug. 18, 1992  [JP]  Japan .................................. 4-240088
Nov. 6, 1992   [JP]  Japan .................................. 4-321484

[51] Int. Cl.⁶ .............................. H01L 21/68; G05F 1/00
[52] U.S. Cl. .................... 318/677; 318/563; 318/625; 318/651
[58] Field of Search .................... 318/560, 563, 318/568.2, 568.22, 611, 625, 638, 649, 651, 677, 679, 569, 574, 575, 652, 671; 310/311

[56]   References Cited

U.S. PATENT DOCUMENTS

| 4,025,839 | 5/1977 | Maury ..................... 318/632 |
| 4,422,041 | 12/1983 | Lienau . |
| 4,518,887 | 5/1985 | Yano et al. ............................ 310/328 |
| 4,628,729 | 12/1986 | Thoone . |
| 5,049,799 | 9/1991 | Tsai et al. ................................. 318/652 |
| 5,172,160 | 12/1992 | Van Eijk et al. . |
| 5,203,199 | 4/1993 | Henderson et al. ...................... 73/1 D |
| 5,281,978 | 1/1994 | Kojima et al. . |
| 5,299,075 | 3/1994 | Hanks . |

OTHER PUBLICATIONS

Y. Tomita, et al., "A 6-axes Motion Control Method for Parallel-Linkage-Type Fine Motion Stage", Journal of the Japan Society for Precision Engineering, vol. 58, No. 4, pp. 684-690 (1992).

N. Henmi, et al., "A Six-Degrees of Freedom Fine Motion Mechanism (2nd Report)", Journal of the Japan Society for Precision Engineering, vol. 58, No. 6, pp. 1035-1040 (1992).

*Primary Examiner*—Bentsu Ro
*Attorney, Agent, or Firm*—Fitzpatrick, Cella, Harper & Scinto

[57]   ABSTRACT

A positioning system includes a plurality of actuators for driving an object to be positioned, a plurality of current output type amplifiers for amplifying drive signals from the actuators and for producing drive currents corresponding to the drive signals, and a plurality of acceleration sensors for detecting acceleration of the object in the neighborhood of the actuators. A feedback circuit negatively feeds back the outputs of the acceleration sensors to input sides of the amplifiers such that the actuators are driven in response to the drive currents.

22 Claims, 17 Drawing Sheets

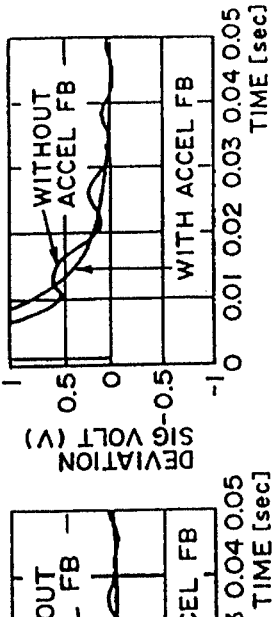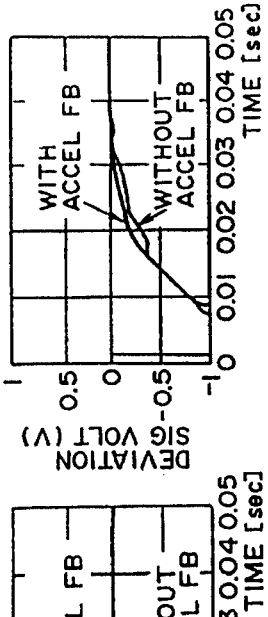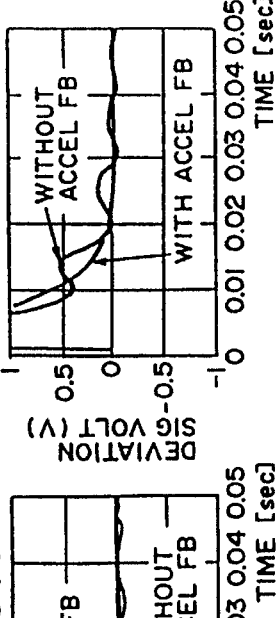
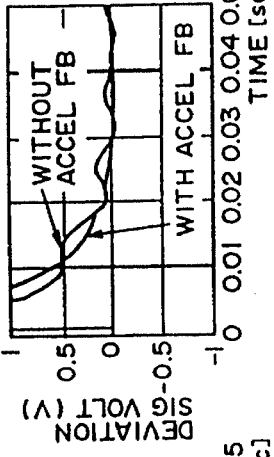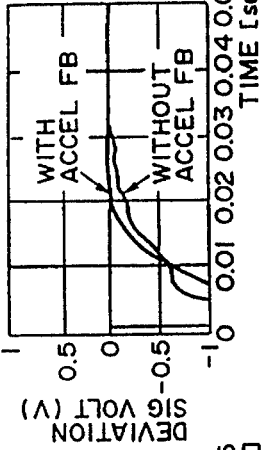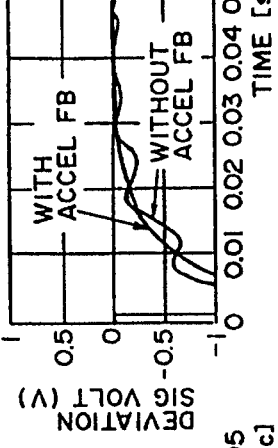
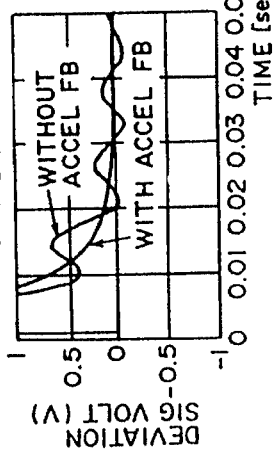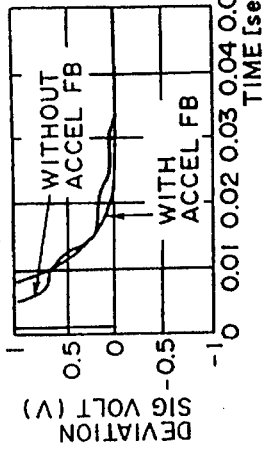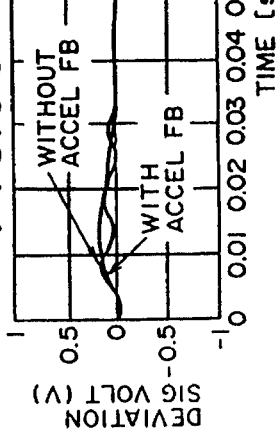

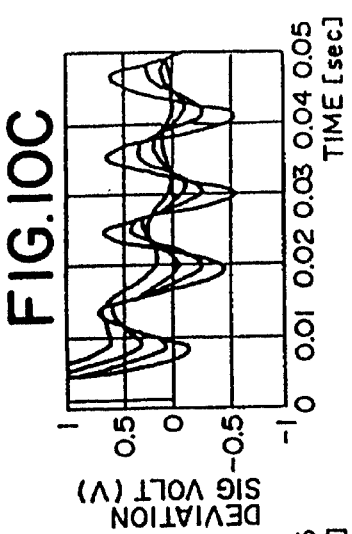
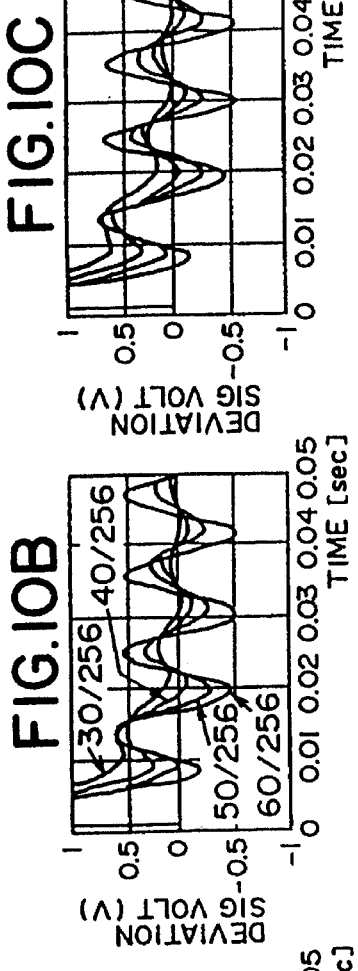
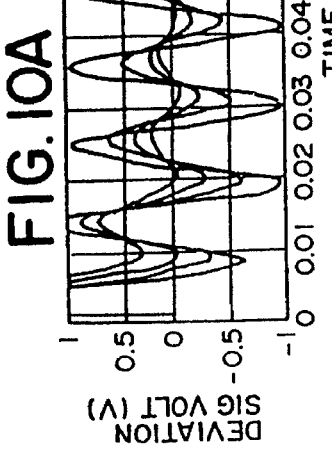
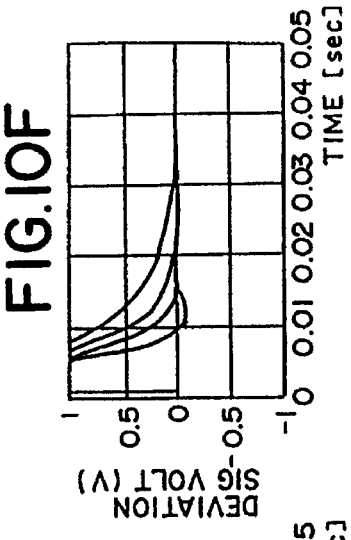
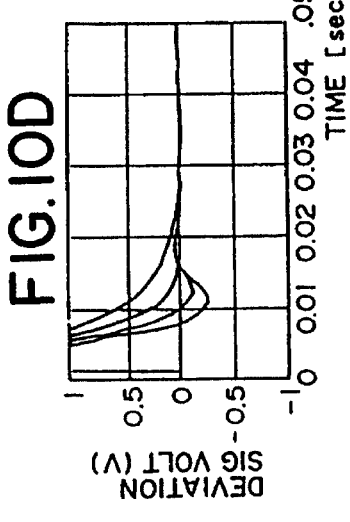

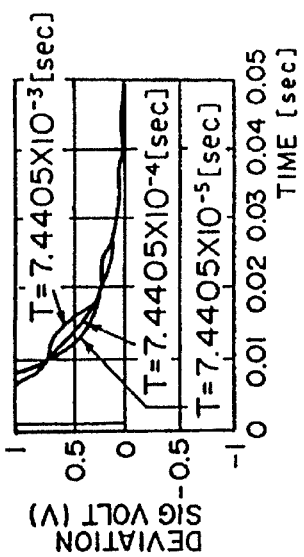
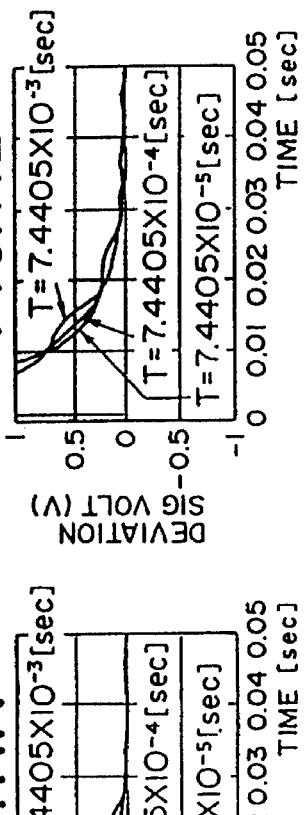
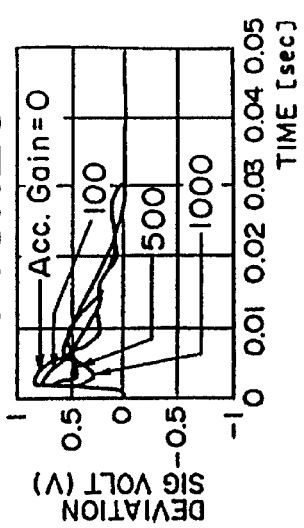
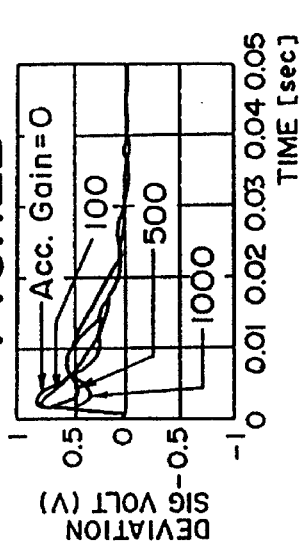
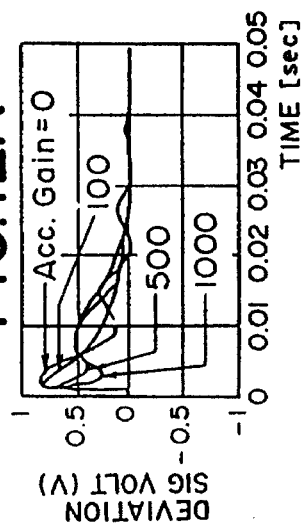

FIG. 15A — RESPONSE OF $e_M$

FIG. 15B — RESPONSE OF $e_R$

FIG. 15C — RESPONSE OF $e_L$

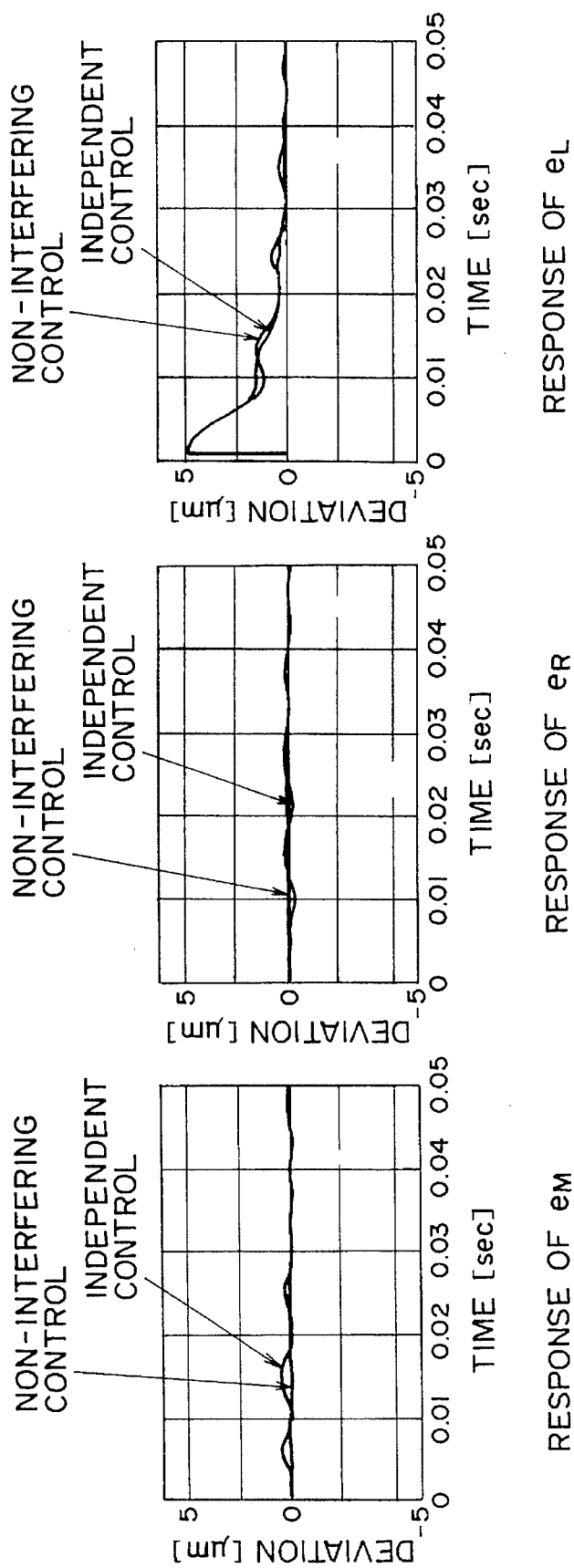

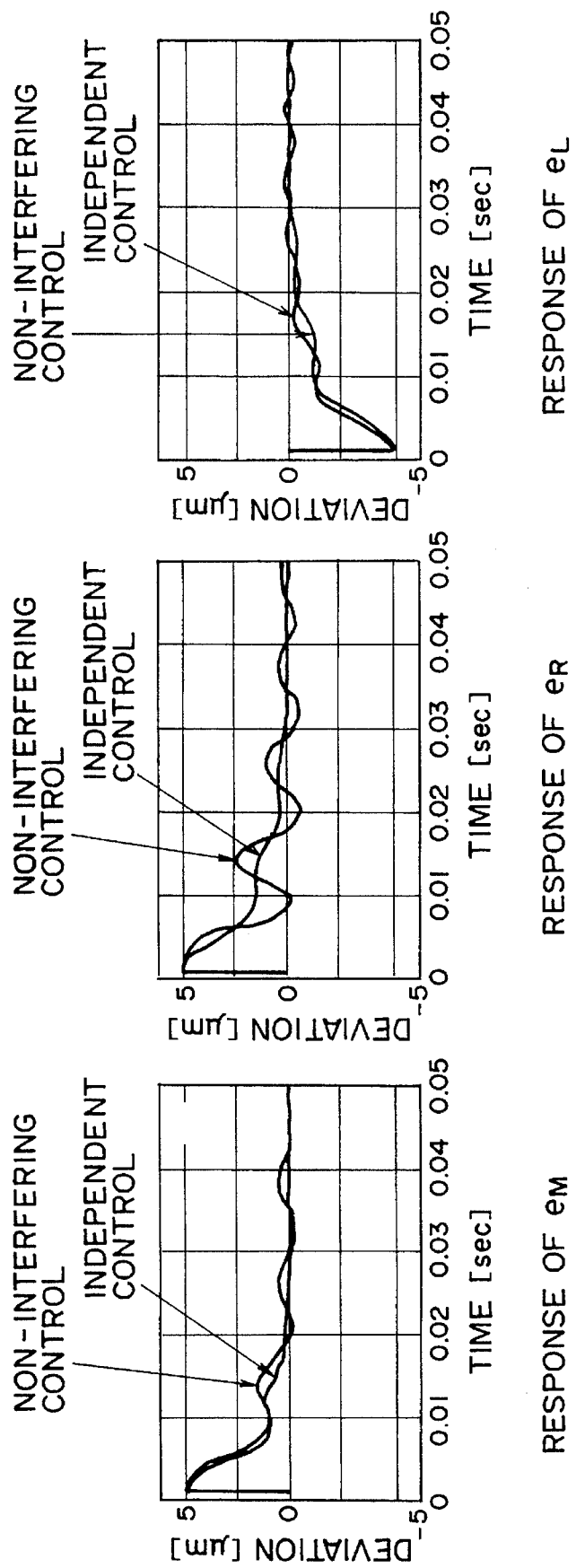

POSITIONING SYSTEM

This application is a continuation of application Ser. No. 08/107,613, filed Aug. 18, 1993, now abandoned.

FIELD OF THE INVENTION AND RELATED ART

This invention relates to a positioning system with an actuator comprising a piezoelectric device or an electrostrictive device, for example, for positioning an article with precision of a submicron order.

For fine positioning technique in the field of precise machining, assembling or adjustment, a positioning precision of a submicron order has been required. Particularly, in an ultra-precise positioning stage to be used for exposure of a fine pattern, a piezoelectric device or an electrostrictive device is used in many cases as an actuator, so as to attain higher driving resolution and a wider range of frequency response. An example is shown in FIG. 16, which is a fine-motion positioning device of a three-freedom type having a function of controlling translation (one freedom) in a vertical direction and tilt in a horizontal plane (two freedoms). This device is arranged so that a stage base 1 on which a semiconductor wafer 100 is placed is positioned by means of actuators 2M, 2R and 2L for displacing the base in the vertical direction in response to applied voltage. The actuators 2M, 2R and 2L each include a piezoelectric device (driving element) and a displacement magnifying mechanism for magnifying the displacement of the piezoelectric device. Position sensors 3M, 3R and 3L are disposed adjacent to the actuators 2M - 2L, for measuring displacement of the base 1 in the vertical z direction. The mechanism constituted by these components may be called a fine-motion positioning mechanism.

Displacement signals measured by the position sensors 3M - 3L are transformed into electric signals by displacement amplifiers 4M, 4R and 4L, respectively. These electric signals are then compared with instruction voltages applied to voltage input terminals 5M, 5R and 5L, respectively, and differential signals $e_M$, $e_R$ and $e_L$ are produced. These differential signals are applied to preamplifiers 6M, 6R and 6L, respectively, for assuring predetermined sensitivity, and output of them are applied to programmable gain devices 7M, 7R and 7L adapted to adjust the characteristic of control loop. With the outputs of them, voltage amplifiers 8M, 8R and 8L are excited, whereby the actuators 2M - 2L are moved upwardly or downwardly to cause translation of the base 1 vertically or to incline it with respect to the z axis in the drawing. The closed loop control system related to the positioning may be called a feedback system, and a fine-motion positioning mechanism which is equipped with such feedback system may be called a fine-motion positioning system.

The voltage amplifiers 8M - 8L are of the type that it outputs an electric current in response to an applied voltage. With this position control loop structure, convergence of steady-state deviation (error) to zero is assured. This is because: the piezoelectric device of the actuator 2M - 2L is electrically a capacitor, and the current output type voltage amplifier 8M - 8L and the transfer function including corresponding piezoelectric device to be driven by the voltage amplifier include an integrator. Thus, the control loop is what is called a "1 type" and, according to the control theory, zero steady-state error is assured.

The positioning system such as described above is discussed in papers such as "A six-degrees of freedom fine-motion mechanism" (second report), Henmi, Sato, Wada, Shimokawabe ("Journal of the Japan Society for Precision Engineering Association", 58/6/1992, pages 1035–1040), or "A six-axes motion control method for parallel linkage type fine-motion stage", Tomita et al ("Journal of the Japan Society for Precision Engineering Association", 58/4/1992, pages 684–690).

SUMMARY OF THE INVENTION

In the fine-motion positioning system such as shown in FIG. 16, the fine-motion positioning mechanism is generally manufactured as comprising three units each including a corresponding actuator 2M, 2R or 2L (having a piezoelectric device and a displacement magnifying mechanism) and a corresponding position sensor 3M, 3R or 3L. These units are disposed along a plane, for drive of the base 1. Here, even though each single unit has a superior damping characteristic, when the base 1 of a large mass is supported by these units, the damping coefficient of the mechanism as a whole becomes small. Therefore, when a feedback mechanism is added to provide a closed loop system, the response becomes vibratory. Namely, while the loop gain with respect to the position should be low for stabilization of the fine-motion positioning system, this would be an obstruction to a reduction in positioning time.

Further, for suppressing disturbance to the fine-motion positioning mechanism, the loop gain of the closed loop system should be large. However, increasing the Loop gain is limited if the mechanism has small damping. For example, the graph of FIG. 17 illustrates the root locus of the three-freedom fine-motion positioning system of FIG. 16. The root of the closed loop system was plotted by x, as programmable gain devices 7M, 7R and 7L were increased from zero for each 5/256. It is seen from this graph that the lowest-order one of the three complex-conjugate roots (i.e., z-axis translation motion) easily enters the right-hand side of the complex plane with the increase of the programmable gain and it become unstable.

It is accordingly a first object of the present invention to provide a fine-motion positioning system in which the positioning operation is stabilized or the strength to disturbance and positioning speed thereof are improved.

A fine-motion positioning system according to one preferred form of the present invention comprises: a planar base with which the positioning operation of one freedom of translation and two freedoms of rotation can be done; three actuators disposed approximately concentrically for the positioning operation, for moving the beset three position sensors each for measuring displacement of the base in the neighborhood of a corresponding actuator; and a feedback system comprising a preamplifier, a programmable gain device and a current output type voltage amplifier. The output of each position sensor is compared with a reference voltage to produce a differential signal on the basis of which the voltage amplifier is excited through the preamplifier and the programmable gain device, and wherein each actuator is driven in response to the output current of the voltage amplifier. The positioning system further comprises an acceleration sensor for detecting acceleration of the base, in the neighborhood of the actuator; and an acceleration feedback circuit including a lowpass filter having a suitable time constant and a gain, with which the output of the acceleration detector is negatively fed back to the input side of the voltage amplifier.

The feedback system may comprise a preamplifier, a programmable gain device, a lowpass filter having a suitable time constant, and a current output type voltage amplifier. The output of each position sensor is compared with a reference voltage to produce a differential signal on the basis of which the voltage amplifier is excited through the preamplifier, the programmable gain device and the lowpass filter, and wherein each actuator is driven in response to the output current of the voltage amplifier. In that occasion, the acceleration feedback circuit may comprise an amplifier having a suitable gain, with which the output of the acceleration detector is negatively fed back to the input side of the lowpass filter.

If the position control loop gain of the feedback system is increased for suppressing disturbance or reducing the positioning time, for example, without the acceleration feedback circuit, the position of the base easily becomes vibratory and unstable. With the acceleration feedback circuit of this preferred form of the present invention, the damping operation is strengthened and vibration is suppressed. Thus, no vibration occurs even if the loop gain for position control is increased. As a consequence, it is possible to increase the loop gain for position control without inconveniences, and the positioning operation can be accomplished in a reduced time without being disturbed.

The performance of a fine-motion positioning system may be determined in respect to the positioning time and the position precision. When the actuators 2M - 2L and the position sensors 3M - 3L are suitably disposed with respect to the base 1 and independent feedback systems are added to these mechanisms, the improvement of the performance is limited due to the interference (interaction) among respective drive axes. Thus, for further reduction of positioning time or further enhancement of positioning precision, it is necessary to remove such interference. For example, in the case of precise positioning with a fine-motion positioning mechanism such as shown in FIG. 16, a control device by which the interference resulting from spatial disposition of the actuator and the position sensor is removed ant only a specified axis is made responsive has been proposed. This is discussed in the aforementioned paper, "A six-axes motion control method for parallel linkage type fine-motion stage", Tomita et al ("Journal of Precise Engineering Association", 58/4/1992, pages 684–690). Simply stated, the transformation matrix from the displacement by actuator drive to the positioning point attitude and the transformation matrix from that attitude to the position sensor output are predicted, and respective inverse matrix operations are inserted into the pre-stage of the voltage amplifier and the post-stage of the position sensor, respectively, to thereby provide a closed loop system. Here, this is called a non-interacting (non-interfering) control, while the conventional control in which no such inverse matrix operation is inserted is called an independent control.

With the non-interacting control, there is an advantage that the static interference (interaction) of the mechanism is released and non-interaction is accomplished. As proof of an advantageous effect of the non-interacting control, in that paper the positioning characteristic is pointed out. For example, it reports the results of an experiment that, when rotational motion was designated, excitation of another motion mode was extraordinarily suppressed.

However, according to the studies made by the inventors of the subject application as to the applicability of that paper to the fine-motion positioning mechanism shown in FIG. 16, it has been confirmed that the performance cannot be improved constantly. FIGS. 18A–18C illustrate the differential signals $e_M$, $e_R$ and $e_L$ as a voltage was applied only to the instruction voltage input terminal 5L. In the case of conventional independent control, there appeared differential signals also in the axes M and R, other than the axis L to which the instruction voltage was applied. However, when the non-interacting control was made, differential signals $e_M$ and $e_R$ other than the voltage-applied axis L did not appear. Thus, apparently it seemed that the non-interacting control assured the operation just intended. Namely, since any response other than the designated axis was not mixed into it, it seemed that reduction of positioning time and increase of positioning precision could be expected. However, the inventors wondered whether the superiority of the non-interacting control to the independent control could be held for every motion attitude to be designated to the base 1.

Thus, the inventors made performance comparison to the independent control and the non-interacting control while changing the pattern of instruction voltage application. FIGS. 19A–19C illustrate differential signals $e_M$, $e_R$ and $e_L$ as instruction voltages corresponding to +5, +5 and −5 (μm) was applied stepwise to the voltage input terminals 5M, 5R and 5L, respectively. In that case, the response is more deteriorated with the non-interacting control. Particularly, the differential signal $e_R$ is vibratory. Therefore, it can be said that the positioning performance of the non-interacting control is not always superior to that of the independent control.

Further, the insertion of inverse matrix operation leads to complicatedness of the structure of the control system. Also, it requires some identification means for predicting the parameters of an inverse matrix operation to be inserted. This necessarily results in the necessity of a complicated adjustment for attaining satisfactory performance of the control device. In any case, the non-interacting control does not always assure improvement of positioning performance, and there is even a possibility of a deteriorated response.

It is accordingly a second object of the present invention to provide a fine-motion positioning system of simple structure which assures improved non-interacting control and improved positioning performance.

In accordance with an aspect of the present invention, the fine-motion positioning system does not use such complicated non-interacting control method that inverse matrix operations of transformation matrix based on the spatial disposition of actuators and position sensors are inserted into a closed loop. Rather, the fine-motion positioning mechanism itself has a statically and also dynamically non-interacting structure. Namely, any static and dynamic interference (interaction) within the fine-motion positioning mechanism itself is removed, and, to such fine-motion positioning mechanism, a feedback system for driving an actuator on the basis of the output of a position sensor is added.

More specifically, referring to FIG. 16, now the mass of the stage base 1 of the positioning mechanism is denoted by m, and the moments of inertia about x and y axes of x-y coordinates having an origin at the center of the principal axes of inertia are denoted by Jx and Jy. Actuators 2M - 2L are disposed concentrically along a circle of radius $1_d$. When the actuator 2M of the three actuators is disposed at the position $(0, 1_d)$ of the x-y coordinates, the remaining two actuators 2R and 2L may preferably be disposed in the fourth and third quadrants of the x-y coordinates, in terms of balance, with the angles in this disposition being denoted by $\theta_d$. Here, the fine-motion positioning mechanism satisfies equations (a) and (b), below:

$$l_d = \{(J_x + J_y)/m\}^{1/2} \tag{a}$$

$$\theta_d = \sin^{-1}[J_x/(J_x + J_y)] \tag{b}$$

To such fine-motion positioning mechanism based on the above equations, a feedback system is added to provide a fine-motion positioning system in which in the feedback system the outputs of three position sensors 3M, 3R and 3L are compared with a reference voltage to provide differential signals $e_M$, $e_R$ and $e_L$ on the basis of which voltage amplifiers 8M, 8R and 8L are excited through preamplifiers 6M, 6R and 6L and compensators 7M, 7R and 7L to thereby drive the actuators 2M - 2L, respectively.

In terms of dynamics, equations (a) and (b) mean that the driving points of actuators provide the "center of percussion" to the base 1. With this arrangement, the fine-motion positioning mechanism itself has a statically and also dynamically non-interfering structure. To such mechanism, a closed loop for driving each actuator on the basis of positional information from a corresponding position sensor is defined. Thus, as the control loop, three simple single-loops are provided. Also, since the fine-motion positioning mechanism itself has a non-interacting structure, the performance can be improved easily by increasing the loop gain of the control system. As compared therewith, if such three single-loops are provided to a conventional fine-motion positioning mechanism which does not satisfy the relations of equations (a) and (b), there is a limitation to increasing the loop gain due to interference components from the other axes. Thus, the positioning performance is limited.

With the fine-motion positioning system of the present invention, improved non-interacting control is assured without the necessity of parameter identification or an adjusting operation. Thus, the productibility is improved and the cost of the device is reduced.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 9A–9I illustrate differences in step response with and without acceleration feedback in the system of FIG. 1.

FIGS. 10A–10F illustrate changes in step response as the position loop gain in the system of FIG. 1 is increased successively.

FIGS. 11A–11C illustrate changes in differential signal during z-axis translation motion as the time constant of the lowpass filter of the FIG. 1 system is changed.

FIGS. 12A–12C illustrate changes in input voltage applied to a voltage amplifier as the acceleration feedback gain in the FIG. 1 system is increased.

FIGS. 18A–18C illustrate step response waveforms, for comparison between non-interacting control and conventional independent control.

FIGS. 19A–19C illustrate step response waveforms, for explaining an example wherein the step response become vibratory in conventional non-interacting control.

DESCRIPTION OF THE PREFERRED EMBODIMENTS

Figure 1:
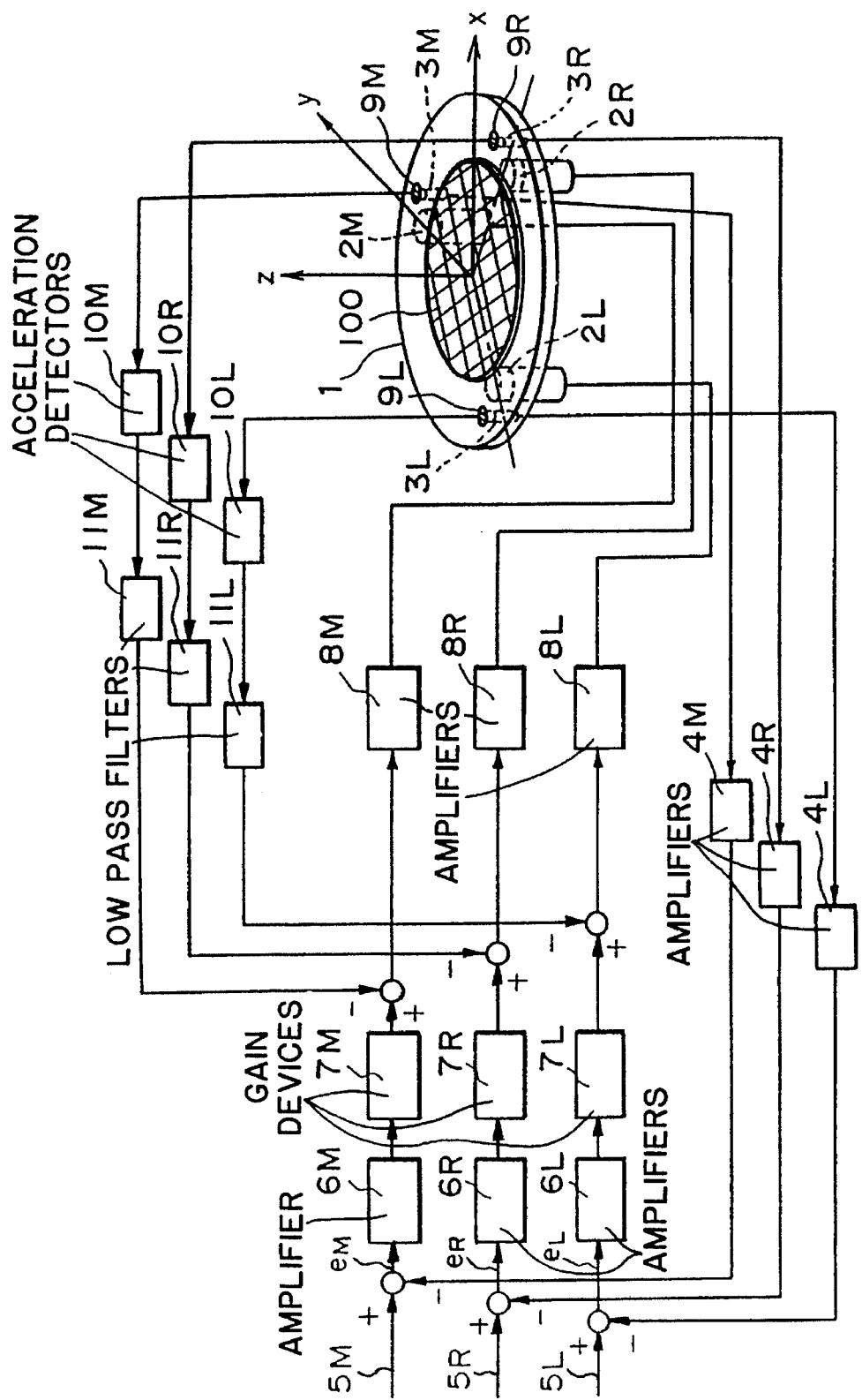
FIG. 1 is a block diagram of a fine-motion positioning system with acceleration feedback, according to a first embodiment of the present invention.
Figure 16:
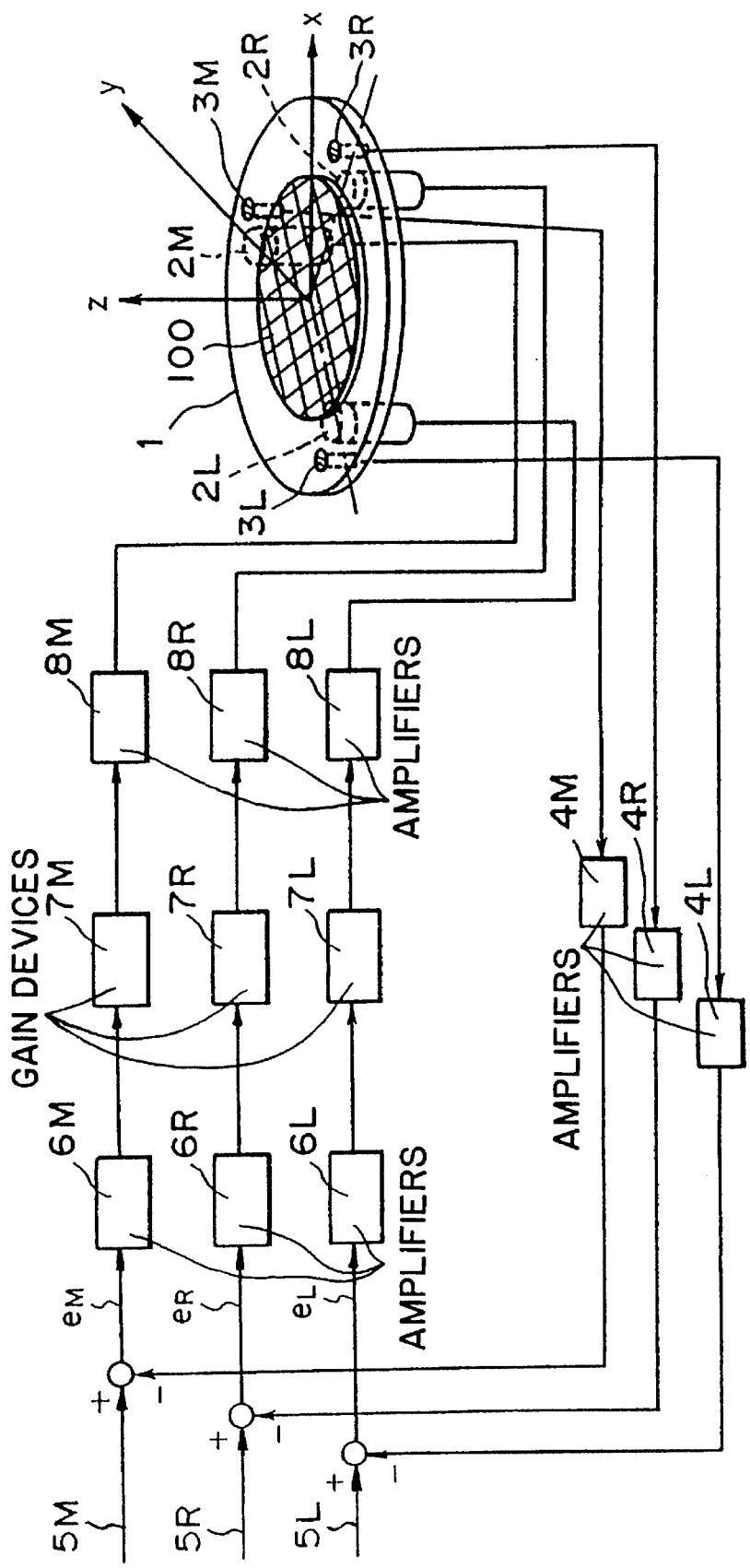
FIG. 16 is a block diagram of a three-freedom fine-motion positioning system of known type.
Figure 17:
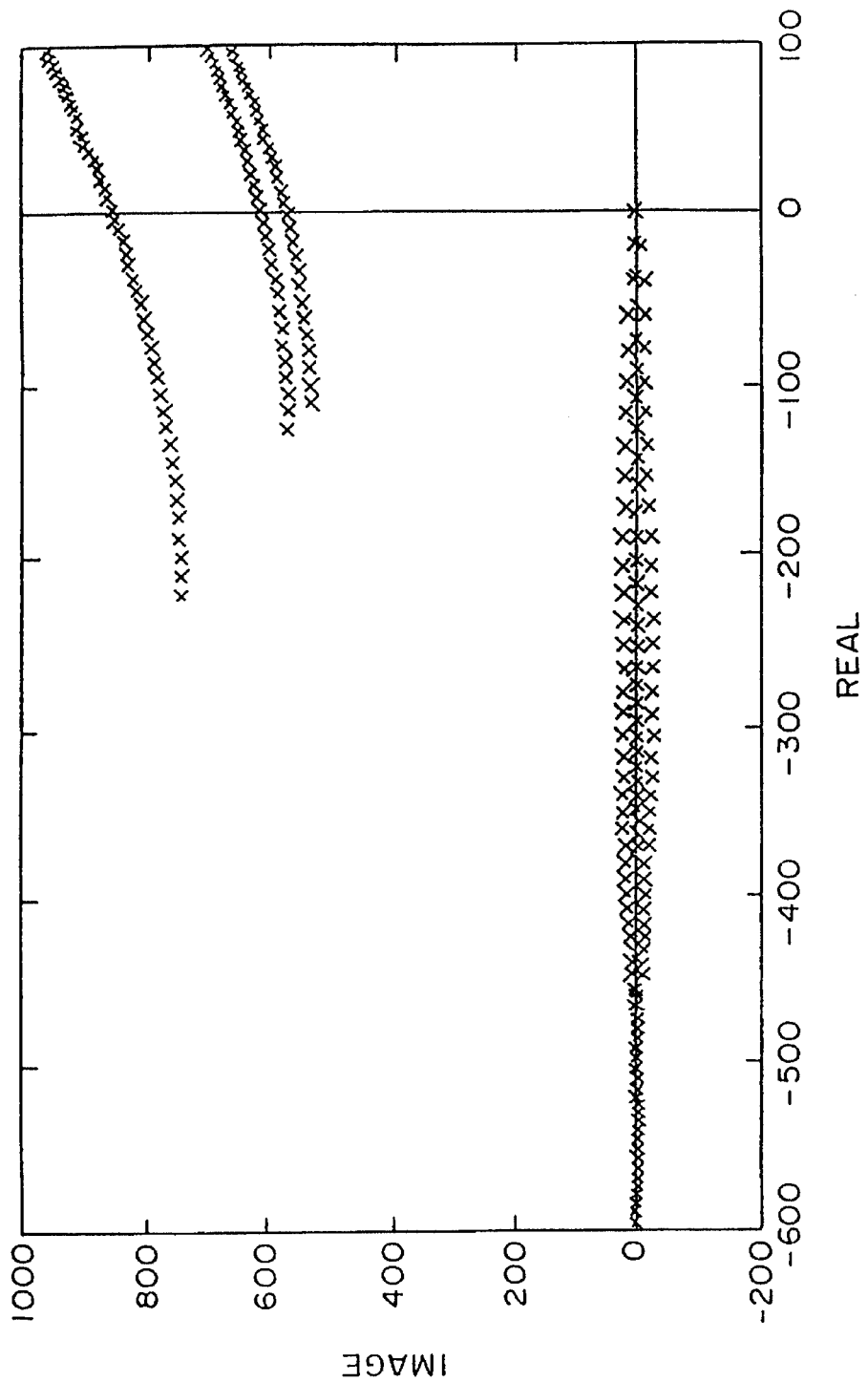
FIG. 17 is a graph of root locus of the FIG. 16 system.

FIG. 1 is a block diagram of a fine-motion positioning system with an acceleration feedback function, which system can be incorporated into an exposure apparatus for the manufacture of microdevices, for example. In this embodiment, as compared with the fine-motion positioning device of FIG. 16 comprising a fine-motion positioning mechanism and a feedback system, an acceleration feedback loop is added. More specifically, acceleration sensors 9M, 9R and 9L are mounted at those positions very close to position sensors. The outputs of these acceleration sensors are transformed into electric signals by acceleration detectors 10M, 10R and 10L, respectively, and through lowpass filters 11M, 11R and 11L each having a suitable time constant and an amplifying function, they are negatively fed back to prestages of current output type voltage amplifiers 8M, 8R and 8L, respectively.

Figure 5:
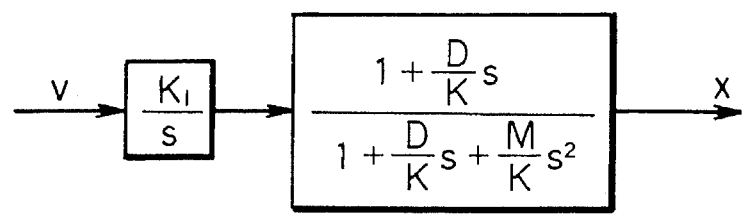
FIG. 5 is a schematic view for explaining one axis of the fine-motion positioning mechanism of the FIG. 1 embodiment.

Referring to the block diagram of FIG. 5, the principle of acceleration feedback for one-freedom control will be explained. FIG. 5 illustrates one axis of the fine-motion positioning mechanism. The basic transfer function of a piezoelectric actuator is such as expressed by equation (1) below and, since the voltage amplifier for piezoelectric device drive is of a current output type, it is expressed as an integrator of a gain $K_I$. In equation (1) below, M is the mass, K is the spring constant and D is the viscous friction coefficient:

$$(Ds+K)/(Ms^2+Ds+K) = (2\zeta_0 T_0 s+1)/(T_0^2 s^2+2\zeta_0 T_0 s+1) \tag{1}$$

where $T_0 = (M/K)^{1/2+cc}$ $\zeta_0 = D/2(MK)^{+c,fra\ 1/2}$

Figure 6A:
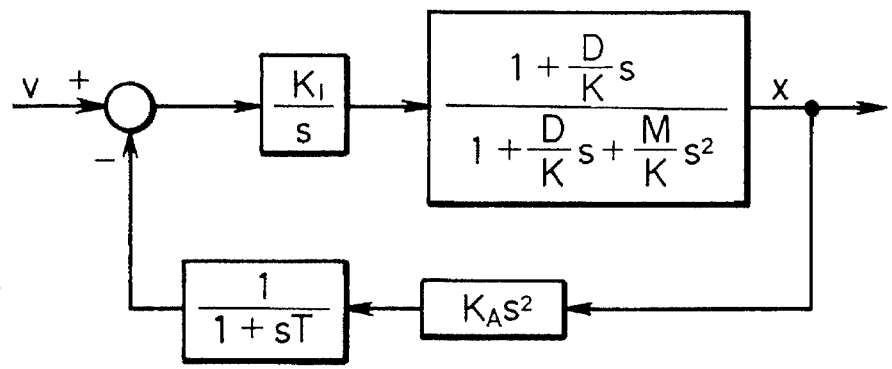
FIGS. 6A and 6B are schematic views for explaining acceleration feedback to the fine-motion positioning mechanism of FIG. 5.

Here, while using a model of one freedom, two types of acceleration feedback to the fine-motion positioning mechanism will now be considered. Referring first to FIG. 6A, the transfer function from the input voltage v of the voltage amplifier to the displacement x can be expressed by equation (2) below:

$$X/V = K_I(1 + 2\zeta_0 T_0 s)/ \qquad (2)$$
$$[s(1 + 2\zeta_0 T_0 s + T_0^2 s^2) +$$
$$K_A K_I s^2 \{(1 + 2\zeta_0 T_0 s)/(1 + sT)\}]$$

Here, if the time constant T is selected to satisfy $T = 2\zeta_0 T_0$, then equation (3) below is obtained:

$$X/V = K_I(1 + 2\zeta_0 T_0 X)/[s\{1 + (2\zeta_0 T_0 + K_A K_I)s + T_0^2 s^2\}] \qquad (3)$$

It is seen from equation (3) that, as a result of application of damping owing to the acceleration feedback, the root of the fine-motion positioning mechanism is set in the innermost part of the left half of the complex plane. Therefore, it is expected that the loop gain can be increased if a closed loop is defined.

Next, referring to FIG. 6B, the transfer function from the input voltage v of the voltage amplifier to the displacement x is expressed as equation (4) below:

$$X/V = K_I\{(1 + 2\zeta_0 T_0 s)/(1 + sT)\}/ \qquad (4)$$
$$[\{s(1 + 2\zeta_0 T_0 s + T_0^2 s^2) +$$
$$K_A K_I s^2 (1 + 2\zeta_0 T_0 s)/(1 + sT)\}]$$

Similarly to the derivation of equation (3), if the time constant T is selected to satisfy $T = 2\zeta_0 T_0$, then equation (5) is obtained:

$$X/V = K_I/[s\{1 + (2\zeta_0 T_0 + K_A K_I)\ s + T_0^2 s^2\}] \qquad (5)$$

Similarly, in the case of equation (3), as result of application of damping owing to the acceleration feedback, the tool of the fine-motion positioning mechanism is set in the innermost part of the left half of the complex plane. Additionally, in this case, a transfer function without zero point is provided.

Next, referring to FIGS. 7A–7C, description will be made to that, in a case where a closed loop of position is defined in a case where acceleration feedback is not provided, and in a case where acceleration feedback is provided, the loop gain can be increased as compared with the conventional control system. FIGS. 7A–7C correspond to the cases where acceleration feedback is provided in the cases of FIGS. 6A and 6B and the case of FIG. 5. The results of stabilization analysis in the cases of FIGS. 7A–7C are such as expressed in equations (6), (7) and (8), where $K_{loop} = K_{loop}' K_I$.

$$2\zeta_0 T_0/\{T_0^2(1 - 4\zeta_0^2)\} > K_{loop} \qquad (1 > 4\zeta_0^2) \qquad (6)$$

$$0 < K_{loop} \qquad (1 < 4\xi_0^2)$$

$$(2\zeta_0 T_0 + K_A K_I)/[T_0^2\{1 - 2\zeta_0(2\zeta_0 T_0 + K_A K_I)/T_0\}] > K_{loop} \qquad (7)$$

$$(1 > 2\zeta_0(2\zeta_0 T_0 + K_A K_I)/T_0)$$

$$0 < K_{loop}$$

$$(1 < 2\zeta_0(2\zeta_0 T_0 + K_A K_I)/T_0)$$

$$(2\zeta_0 T_0 + K_A K_I)/T_0^2 > K_{loop} \qquad (8)$$

Here, while using the parameters of Table 1, below, that or those of the control structure of FIG. 7 whose loop gain can be easily increased are specified. Namely, each one whose basic transfer function has a complex root corresponds to this, and magnitude relation of equations (6)–(8) is checked.

TABLE 1

| SYMBOL | UNIT | NUMERIC VALUE |
|---|---|---|
| M | Kg | 10.5 |
| D | Nsec/m | $1.282 \times 10^3$ |
| K | N/m | $1.723 \times 10^6$ |
| $K_A, K_I$ | sec | $1.0 \times 10^{-4}$ |

Figure 6B:
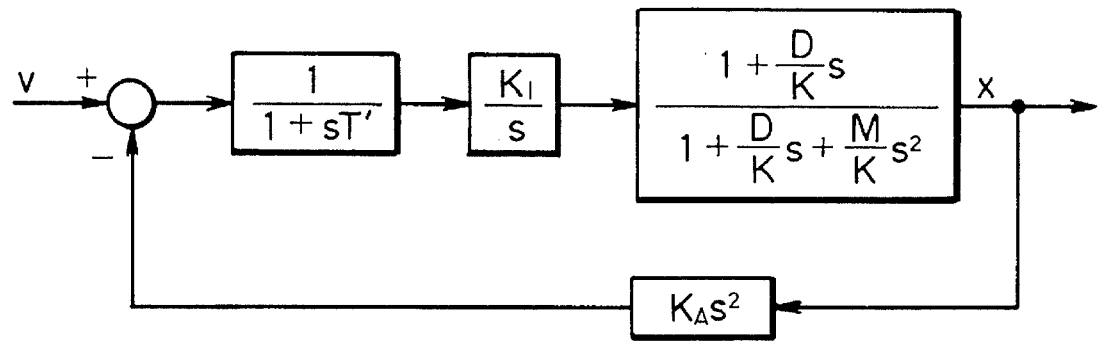
Figure 7A:
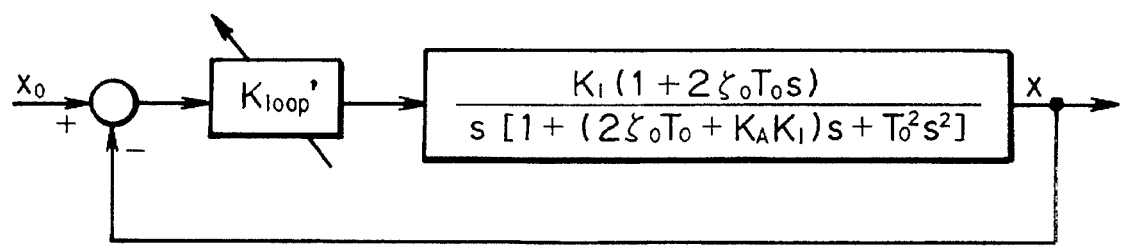
FIGS. 7A–7C are schematic views each for explaining a case where a position closed loop system is provided to the control system of FIG. 5 or 6.
Figure 7B:
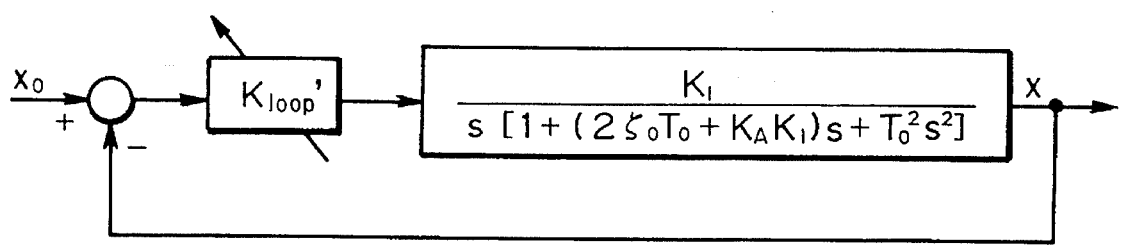
Figure 7C:
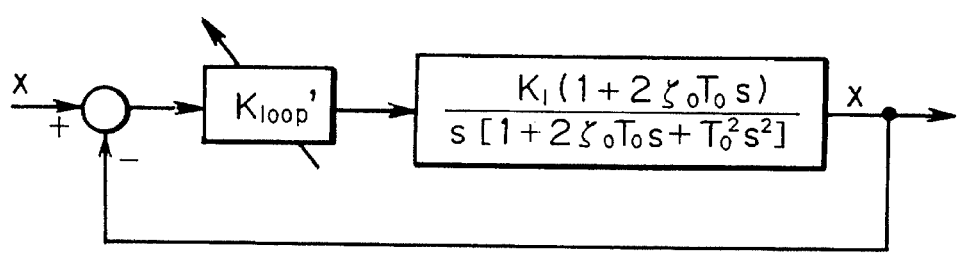
Figure 8A:
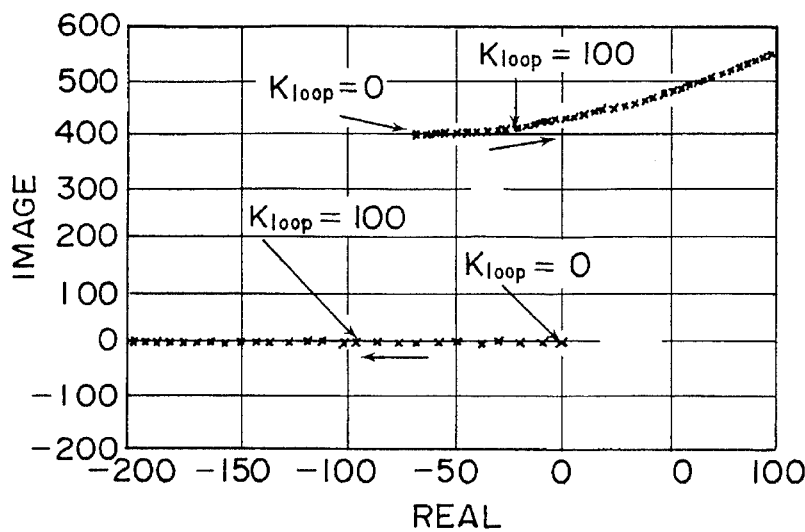
FIGS. 8A–8C are graphs which each illustrates the root locus of the position closed loop system of corresponding one of FIGS. 7A–7C.
Figure 8B:
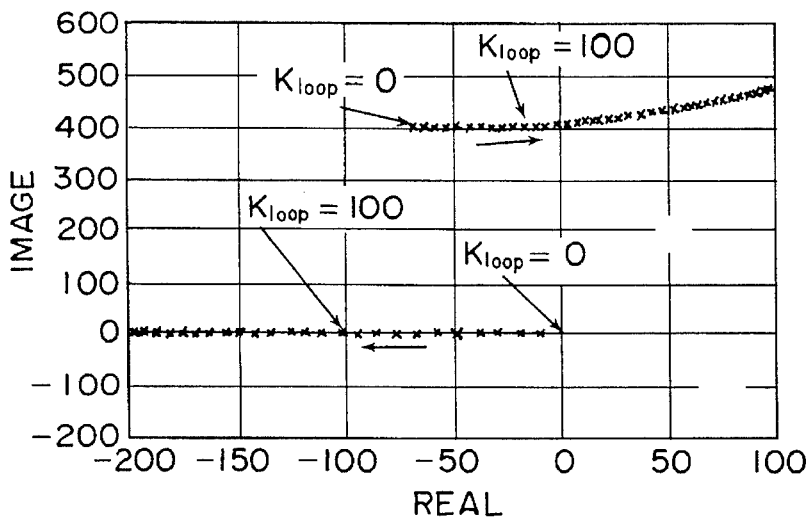
Figure 8C:
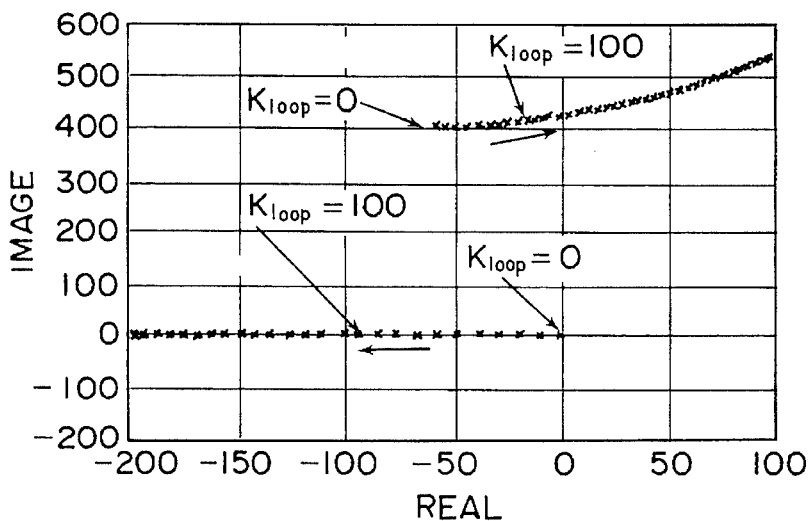

FIGS. 8A–8C illustrate the results in the cases of FIGS. 7A–7C, and they depict the position (mark x) of The root upon the complex plane as the $K_{loop}$ is increased from zero, at a rate of 10. Arrows in the drawings denote the direction of movement of the root due to the increase of $K_{loop}$. The ranking of liability of unstableness with the increase of $K_{loop}$ is the FIG. 8C case, the FIG. 8B case and the FIG. 8A case, in that order. That is, the acceleration feedback such as of FIG. 6A or 6B is used to provide a closed loop of position, the loop gain of position can be enlarged significantly as compared with a case where the feedback is not provided.

In the system of FIG. 1, of the two types of acceleration feedback systems shown in FIGS. 6A and 6B, the acceleration feedback of FIG. 6A is applied to a three-freedom fine-motion positioning mechanism. As shown in FIG. 1, acceleration sensors 9M, 9R and 9L are disposed at the same locations as displacement sensors 3M, 3R and 3L, respectively, and the outputs of them are negatively fed back to the pro-stage of current output type voltage amplifiers 8M, 8R and 8L, respectively. Here, the outputs of the acceleration sensors 9M - 9L are received by primary lowpass filters 11M, 11R and 11L, respectively, each having a time constant effective to cancel the zero point determined by Ds+K in equation (1), whereby a suitable gain is imparted. In place of using physical parameters in Table 1, numerical experiments were carried out while using parameters of the three-freedom fine-motion positioning mechanism itself.

FIGS. 9A–9I illustrate the results of an examination which was made on differences in step response caused with and without acceleration feedback, under the condition of the same loop gain of the position control system. FIGS. 9A–9C correspond to the cases of z-axis translational motion. FIGS. 9D–9F correspond to the cases of rotational motion about x axis, and FIGS. 9G–9I correspond to the cases of rotational motion about y axis. In the order from the left-hand sides of the figures, changes in voltage of the differential signals $e_M$, $e_R$ and $e_L$ with time are illustrated. Reference character FB in the drawing denotes feedback. It is seen from the drawings that, with the acceleration feedback, in the response just after step application the differential signal somewhat expands as compared to that without acceleration feedback. However, in a portion as the difference becomes equal to zero with the lapse of time, the stabilization (settling) is better in the case where acceleration feedback is done, and reduction of positioning time is attained.

FIGS. 10A–10F illustrate the results of a comparison which was made in respect to changes of step response, between cases with and without acceleration feedback, as the loop gain of position was increased successively. FIGS. 10A–10C correspond to the cases without acceleration feedback, and FIGS. 10D–10F correspond to the cases having acceleration feedback. In all the cases as illustrated, stepwise translational motion is applied in the direction of the z-axis. Like the examples in FIGS. 9A–9I, in the order from the left-hand side of the figures, changes in voltage of the differential signals $e_M$, $e_R$ and $e_L$ with time are illustrated. Numerical values designated in the drawings correspond to the set values of the programmable gain devices 7M, 7R and 7L. The loop gain was changed by controlling those gains. It is seen from the drawings that in the case without acceleration feedback the system easily becomes vibratory as the loop gain of position is enlarged. On the other hand, in the case with acceleration feedback, it does not become unstable even with similar increase of position loop gain. Thus, it is possible to increase the loop gain of position loop largely in the case where acceleration feedback is done. With this structure, therefore, the settling time for positioning can be made shorter and, additionally, the control system itself can be less sensitive to disturbance.

From FIGS. 9A–9I and 10A–10F, it is confirmed that the acceleration feedback assures reduction of settling time and increase of loop gain.

Now, the time constant of the lowpass filter of the acceleration feedback loop is considered. In derivation of equation (3), the time constant is set to satisfy $T=2\zeta_0 T_0$. This is at the same position as the zero point of the piezoelectric driving mechanism as determined by Ds+K and, actually, there may be some unreliability of setting resulting from an identification error. In consideration of thereof, the effect of any deviation of the time constant T of the lowpass filter was examined. FIGS. 11A–11C illustrate in the order from the left-hand side the voltages of differential signals $e_M$, $e_R$ and $e_L$, respectively, during z-axis translational motion as changes of increase/decrease by one digit were imparted to the center value $T=7.4405\times10^{-4}$ (sec) of the time constant of each of the lowpass filters 11M - 11L. Even with an increase of time constant T by one digit, the stabilization of vibration is good as compared with a case without acceleration feedback. It is seen therefore that the time constant setting of the filter does not have a large effect upon the performance. Of course, a time constant set in a high range provides a good result in respect to the stableness and performance of the control system.

Next, limitation of input which might result from the execution of acceleration feedback is considered. Since the acceleration feedback loop operates only in response to occurrence of acceleration, it does not relate to steady characteristics. Namely, as readily understood from equation (3), no change occurs in the direct current term. Therefore, the addition of acceleration feedback will not cause some input limitation such as saturation, for example. FIGS. 12A–12C illustrate the results of numerical experiments which were made for confirmation, and it depicts changes in input voltage of the voltage amplifiers 8M, 8R and 8L in response to increase of gain of the acceleration feedback loop. More specifically, it illustrates, in the order from the left-hand side, the changes with time of the input voltages of the voltage amplifiers 8M - 8L caused in response to application of stepwise translational motion, equivalent to 5 (μm), in the z-axis direction. It is seen from the drawing that the execution of acceleration feedback does not cause application of excessive drive to the voltage amplifiers 8M - 8L. Thus, no input limitation is caused.

Next, the physical dimension and sensitivity of acceleration sensor are considered. As in the numerical experiments, the control system of the present invention uses high-sensitivity sensors to control minute acceleration. Also, such a sensor should be small since it is to be mounted on the base 1. Preferable examples of such sensor may be a piezoelectric resistance type acceleration sensor based on silicon micromachining technique and an acceleration sensor which uses ceramic series bimorph beam, each being small in size and high in sensitivity. For example, an acceleration sensor of latter type may have a sensitivity 1000 (mV/g), a resolution 0.0005 (gpK), a frequency response 1–2000 (Hz) and a size of 16 mm (diameter) and 13 mm (height). This is sufficient for accomplishing acceleration feedback to be added to the fine-motion positioning mechanism.

While in the preceding embodiment the invention has been described with reference to the addition of acceleration feedback to a fine-motion positioning mechanism including three actuators and having a function for controlling three freedoms (one freedom of translation and two freedoms of rotation), the invention is not limited to such three-freedom fine-motion positioning mechanism. The invention is applicable to a fine-motion positioning mechanism of a larger number of freedoms (e.g. six freedoms).

Also, in the preceding embodiment, the acceleration sensors 9M - 9L are disposed at the same locations as the position sensors 3M - 3L, respectively. However, it is well known that a sensor when disposed at the same location as the actuator driving point (called "co-location") provides good controllability, and the acceleration sensors 9M - 9L may of course be disposed at the same locations as the driving points of the actuators 2M - 2L, respectively. Since a sensor has a finite physical dimension and if non-contact position measurement is to be done, it is difficult to place the position sensors 3M - 3L exactly at the same positions as the actuators 2M - 2L, respectively. However, as regards the acceleration sensors 9M - 9L, since they may be adhered to respective positions of driving points, the condition of co-location can be easily accomplished.

Figure 2:
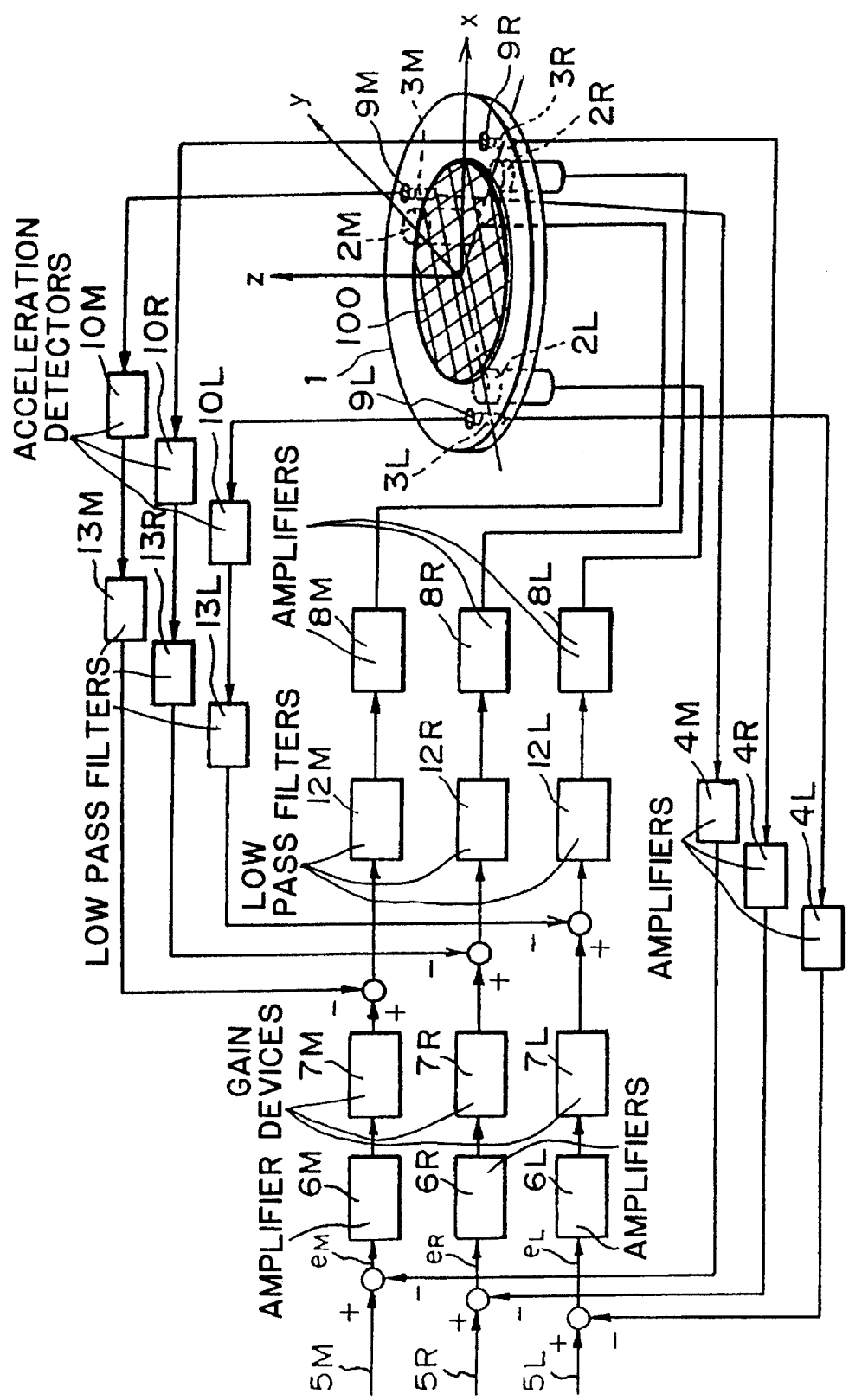
FIG. 2 is a block diagram of a fine-motion positioning system with acceleration feedback, according to a second embodiment of the present invention.

While in the three-freedom fine-motion positioning mechanisms of FIG. 1, the acceleration feedback of FIG. 6A is added with respect to each axis, as an alternative the acceleration feedback of FIG. 6B may be applied to the three-freedom fine-motion positioning mechanism. In FIG. 2, primary lowpass filters 12M, 12R and 12L each having a suitable time constant are inserted into the pre-stage of current output type voltage amplifiers 8M, 8R and 8L. The output of acceleration sensors 9M, 9R and 9L are transformed into electric signals by acceleration detectors 10M, 10R and 10L and, thereafter, while being passed through amplifiers 13M, 13R and 13L each having a suitable amplification rate, they are negatively fed back to the pro-stage of the lowpass filters 12M - 12L.

In accordance with this aspect of the present invention, insufficient damping of a fine-motion positioning mechanism which uses piezoelectric devices, for example, can be compensated by the execution of acceleration feedback. Therefore, there is an advantage of stableness of positioning operation. Also, since the mechanism is stabilized with the acceleration feedback, in a closed loop of position it is possible to enlarge its loop gain as compared with a case without acceleration feedback. Thus, it is possible to provide a fine-motion positioning system which is less sensitive to disturbance and which assures quick positioning operation.

Figure 13:
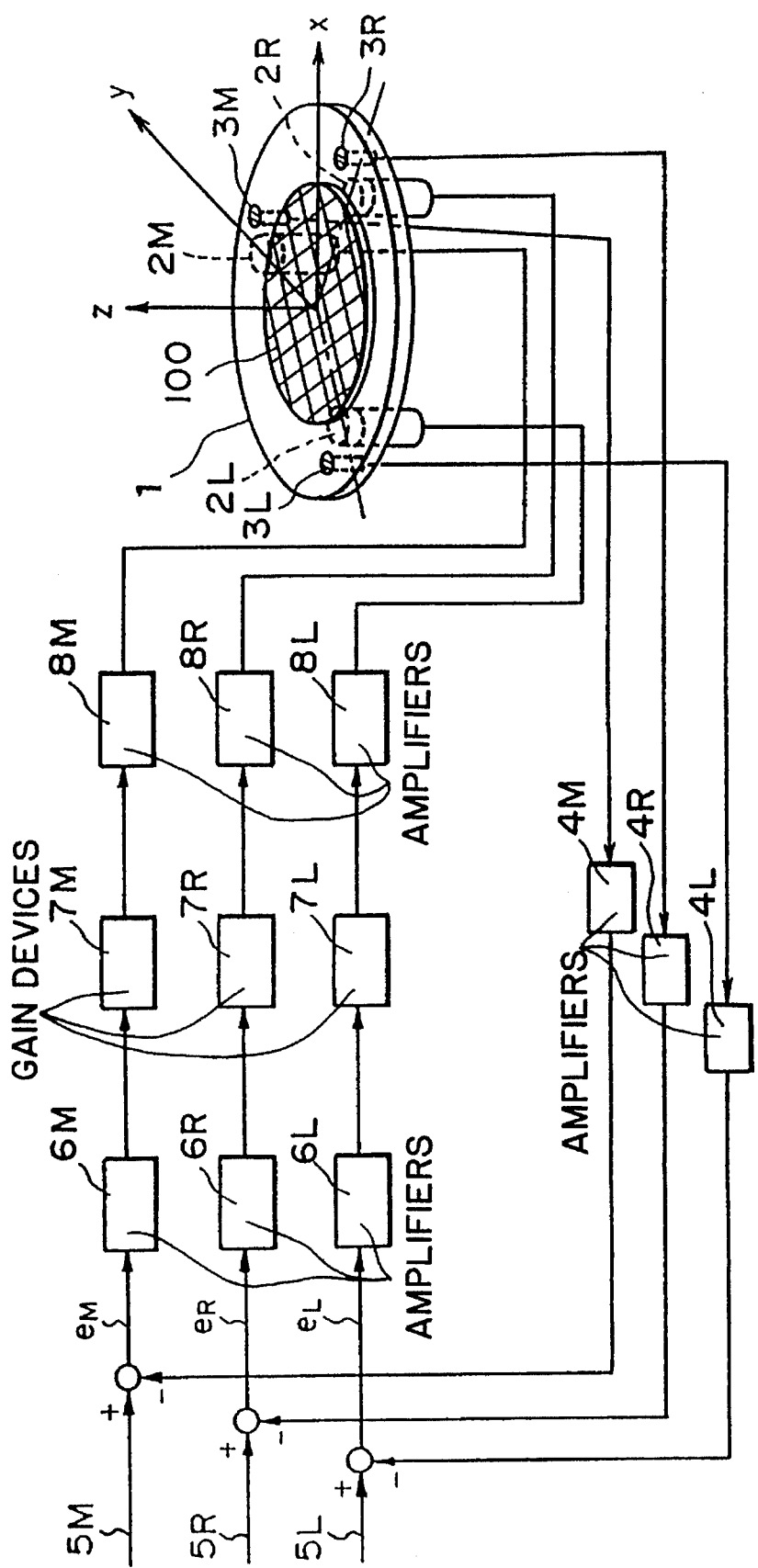
FIG. 13 is a block diagram of a fine-motion positioning system according to a further embodiment of the present invention.

FIG. 13 is a block diagram of a fine-motion positioning system according to another embodiment of the present invention. In this embodiment, the disposition of actuators ant sensors, constituting the fine-motion positioning mechanism, is optimized in accordance with equations (3) and (4) set forth hereinbefore.

Figure 14:
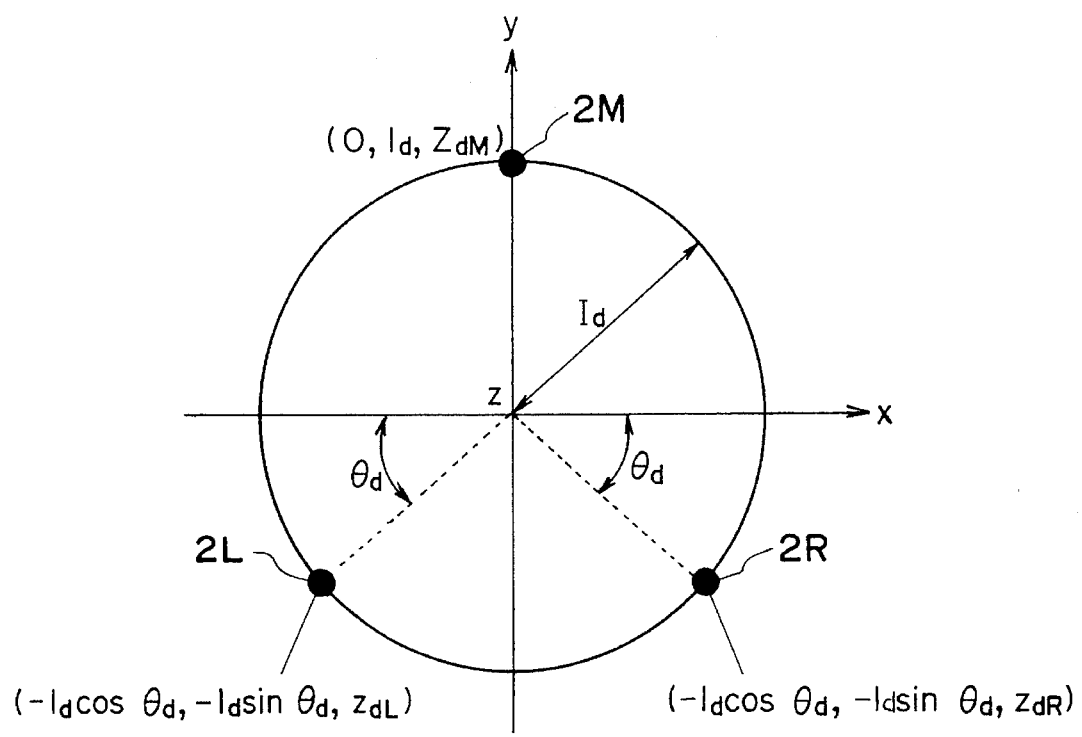
FIG. 14 is a schematic view of a coordinate system, illustrating the disposition of actuators in the system of FIG. 13.

Derivation of these equations will be explained. FIG. 14 illustrates coordinates of a stage base 10 as seen from the above, on which a semiconductor wafer 100 is placed. Denoted in the drawing by painted dots 2M, 2R and 2L are actuators which are disposed at the coordinates illustrated. The center of coordinates coincides with the center of inertia, and the x-y coordinates are so set as illustrated. Here, the kinetic equation is expressed as equation (9) below:

$$M\ddot{X}+D\dot{X}+KK=KJ_{xd}AU+DJ_{xd}A\dot{U} \tag{9}$$

where used characters denote the following:

$X=[z, \theta_x, \theta_y]^T$: displacement vector of principal axes of inertia z [m]: z-axis displacement of principal axis of inertia of base 1

$\theta_x$ [rad]: angle of rotation of base 1 about x axis $\theta_y$ [rad]: angle of rotation of base 1 about y axis M=diag (m, Jx, Jy): inertia matrix m [Kg]: mass of the base 1

Jx [Kgm$^2$]: moment of inertia of base 1 about x axis

Jy [Kgm$^2$]: moment of inertia of base 1 about y axis $[Z_{dM}, Z_{dR}, Z_{dL}]^T$ [m]: z-axis displacement of actuators K [N/m]: spring constant of 2M, 2R and 2L d [Nsec/m]: viscous friction coefficient of 2M, 2R and 2L

A=diag ($a_M$, $a_R$, $a_L$) [m/V]: voltage-to-displacement conversion coefficient $U=[u_M, u_R, u_L]^T$ [V]: applied voltage vector to piezoelectric device $\theta_d$ [rad]: angle of disposition of actuator $l_d$ ]m]: radius superscript T: transposed matrix (.): differential with time s: Laplace operator $J_{xd}$: transformation matrix from actuator drive displacement $[Z_{dM}, Z_{dR}, Z_{dL}]$ to displacement X, being expressed by equation (10), below:

$$J_{xd} = \begin{bmatrix} \sin\theta_d/(1+\sin\theta_d) & 1/2(1+\sin\theta_d) & 1/2(1+\sin\theta_d) \\ 1/l_d(1+\sin\theta_d) & -1/2l_d(1+\sin\theta_d) & -1/2l_d(1+\sin\theta_d) \\ 0 & -1/2l_d\cos\theta_d & 1/2l_d\cos\theta_d \end{bmatrix} \tag{10}$$

D: attenuation coefficient matrix as expressed by equation (11), below:

$$D = \begin{bmatrix} 3d & d(1-2\sin\theta_d)l_d & 0 \\ d(1-2\sin\theta_d)l_d & d(1+2\sin^2\theta_d)l_d^2 & 0 \\ 0 & 0 & 2d\cos^2\theta_d l_d^2 \end{bmatrix} \tag{11}$$

K: rigidity coefficient matrix as expressed by equation (12), below:

$$K = \begin{bmatrix} 3k & k(1-2\sin\theta_d)l_d & 0 \\ k(1-2\sin\theta_d)l_d & k(1+2\sin^2\theta_d)l_d^2 & 0 \\ 0 & 0 & 2k\cos^2\theta_d l_d^2 \end{bmatrix} \tag{12}$$

The relation from applied voltage vector U to displacement vector X is expressed by equation (13), below:

$$X=(Ms^2+Ds+K)^{-1}(Ds+K)J_{xd}AU \tag{13}$$

In this equation, the portion representing the relation from U to X corresponds to the transfer function matrix G(s) of the fine-motion positioning mechanism. Here, the elements are denoted by characters in equation (14), below:

$$G(s) = \begin{bmatrix} G_{11}(s) & G_{12}(s) & G_{13}(s) \\ G_{21}(s) & G_{22}(s) & G_{23}(s) \\ G_{31}(s) & G_{32}(s) & G_{33}(s) \end{bmatrix} \tag{14}$$

Here, the polynomials that provide zero points of $G_{31}(s)$, $G_{12}(s)$ and $G_{32}(s)$ are such as equations (15)–(17), below:

$$(ds+k)(Jx-ml_d^2 \sin\theta_d)s^2 \tag{15}$$

$$(ds+k)(Jx-ml_d^2 \sin\theta_d)s^2(Jys^2 +2dl_d^2 \cos^2\theta_d s+2kl_d^2 \cos^2\theta_d) \tag{16}$$

$$(ds + k)[\{Jx + ml_d^2\sin^2\theta_d)Jy - Jxml_d^2\cos^2\theta_d\}s^4 + \tag{17}$$

$$dl_d^2\{Jy(1 + \sin\theta_d)^2 - (Jx + ml_d^2) - \cos^2\theta_d\}s^3 +$$

$$kl_d^2\{Jy(1 + \sin\theta_d)^2 - (Jx + ml_d^2)\cos^2\theta_d\}s^2]$$

Thus, in these polynomials the condition for making all the coefficients of s equal to zero, can be easily determined, such as expressed in equations (18) and (19), below:

$$Jx+Jy=ml_d^2 \tag{18}$$

$$\sin\theta_d=Jx/(Jx+Jy) \tag{19}$$

Namely, when equations (18) and (19) are satisfied, the transfer functions of non-diagonal term in equation (14) all become equal to zero, and only diagonal components $G_{11}(s)$, $G_{22}(s)$ and $G_{33}(s)$ remain as non-zero. This means that the fine-motion positioning mechanism is made non-interacting, statically and dynamically.

While equations (18) and (19) define conditions for making, equal to zero at once, the coefficients of s of the polynomials that provide the zero points of $G_{31}(s)$, $G_{12}(s)$ and $G_{32}(s)$, simultaneously they also define the conditions for making, equal to zero, the coefficients of s of the polynomials that provide zero points of $G_{13}(s)$, $G_{21}(s)$ and $G_{23}(s)$. Therefore, in accordance with equations (18) and (19), all the non-diagonal terms of equation (14) become equal to zero.

It is to be noted that equation (a) corresponds to the result of solving equation (18) in respect to $l_d$, while taking the mass m of the base 1, the inertia moment Jx about the x axis and the inertia moment Jy about the y axis as being unchangeable (i.e. predetermined). Equation (b) corresponds to the result of solving equation (19) in respect to $\theta_d$. Namely, since modifying the design in terms of m, Jx and Jy largely is not practical, solutions are detected in terms of $l_d$ and $\theta_d$. Of course, any combination of m, Jx and Jy satisfying equations (18) and (19) may be adopted while maintaining $l_d$ and $\theta_d$ unchanged. In any case, by designing the fine-motion positioning mechanism so as to satisfy equations (18) and (19), interacting (interfering) components from those other than the designated drive axis can be avoided.

Figure 15:
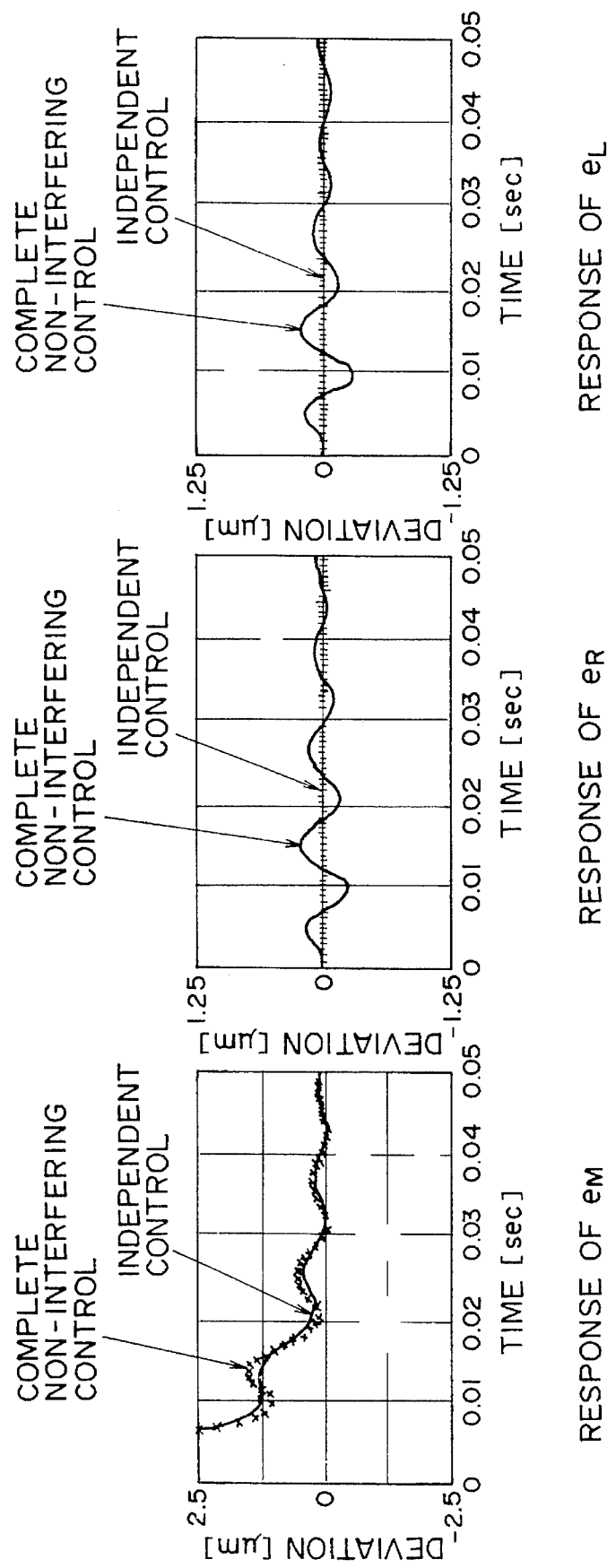
FIGS. 15A–15C illustrate step response waveforms, for comparison between non-interacting control of the present invention and conventional independent control.

Now, the effectiveness of the present invention will be described on the basis of comparison of the step response of the fine-motion positioning system of the present invention with a fine-motion positioning system of independent control type. FIGS. 15A–15C illustrate response waveforms of differential signals $e_M$, $e_R$ and $e_L$ produced as a voltage equivalent to +5 (μm) is applied only to the voltage input terminal 5L. With the non-interacting control of the present invention, the response of the differences $e_R$ and $e_L$ is completely zero. Thus, the advantageous effect of the present invention is clear. Of course, even if any instruction is applied to the voltage input terminal 5M, 5R or 5L, the non-interacting control operates correctly. As compared therewith, in the conventional non-interacting control which is static, depending on the pattern of voltage application to the terminals 5M - 5L, such as shown in FIG. 19, there may be cases wherein the performance is lower than that of the independent control. This is not the case with the present invention.

While in the foregoing the invention has been described with reference to a fine-motion positioning system wherein three actuators 2M - 2L are disposed on the same plane and wherein non-interacting control is executed to its fine-motion positioning mechanism for controlling three freedoms (one freedom of translation and two freedoms of rotation) through vertical z-axis displacement of the actuators, the invention is not limited to such three-freedom fine-motion positioning mechanism. It is applicable to a fine-motion positioning mechanism of a larger number of freedoms. This will be readily understood, since equations (14) –(17) are the conditions for mechanism parameters, making the coefficients of polynomials, providing zero points, all equal to zero at once. In terms of dynamics, equations (18) and (19) mean that each driving point is at the "center of percussion". Thus, it is within the present invention that: a fine-motion positioning system which includes, with respect to a rigid member, actuators of a number at least corresponding to kinetic freedoms to be controlled, position sensors of a number corresponding to the kinetic freedoms, and a feedback system for driving a corresponding actuator on the basis of feedback of corresponding position sensor, wherein the driving points of the actuators are located at the center of percussion.

In accordance with the embodiment of the present invention described hereinbefore, the fine-motion positioning mechanism itself has a non-interacting structure, avoiding static and dynamic interaction (interference). To such mechanism, a closed loop for controlling the actuators on the basis of positional information from the position sensors is added. Thus, the control loop can be provided by simple three single loops. This makes the structure very simple. Also, since the fine-motion positioning mechanism itself has non-interacting structure, increasing the loop gain of the control system to improve the performance is very easy. Further, parameter identification or adjustment operation is not necessary. Therefore, the productibility is high and cost of the system is low.

Now, description will be made on the manufacture of semiconductor devices by using an exposure apparatus into which a fine-motion positioning system of the present invention is incorporated.

Figure 3:
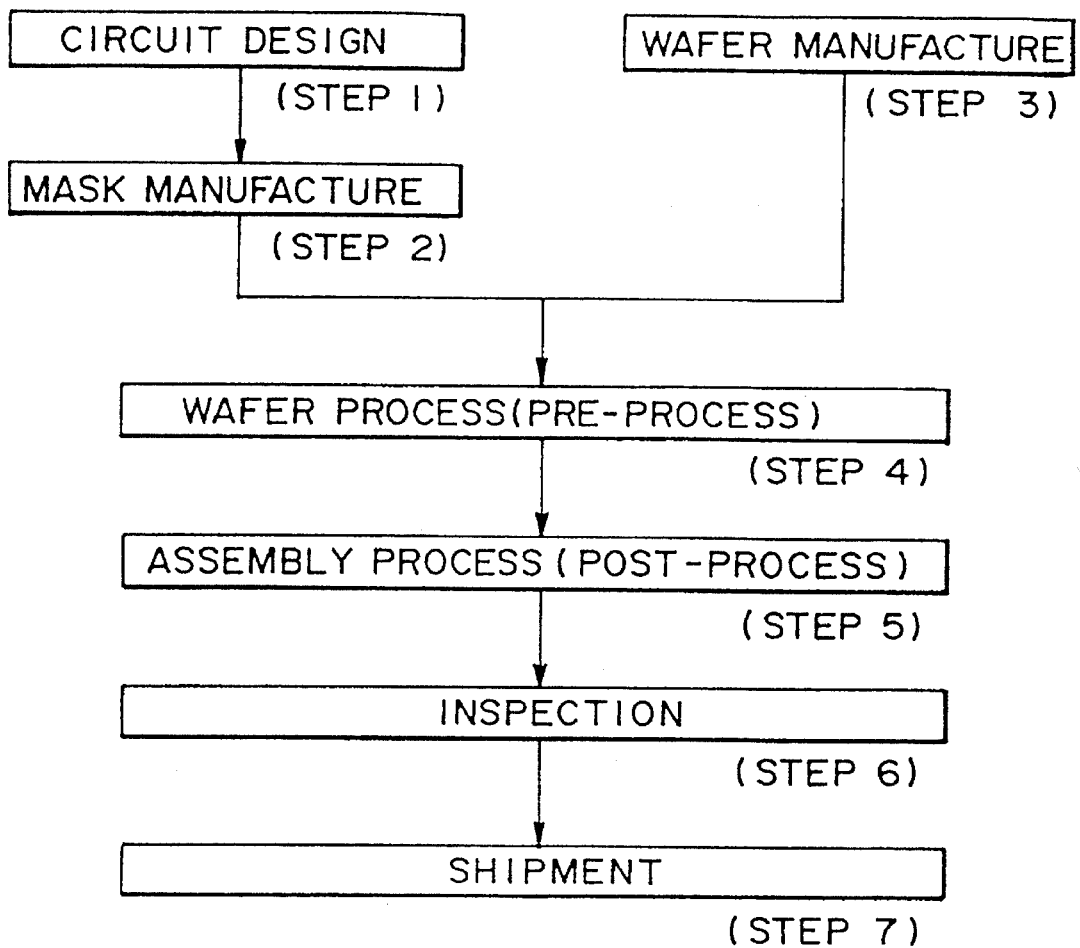
FIG. 3 is a flow chart of semiconductor device manufacturing processes.

FIG. 3 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask ant wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 4:
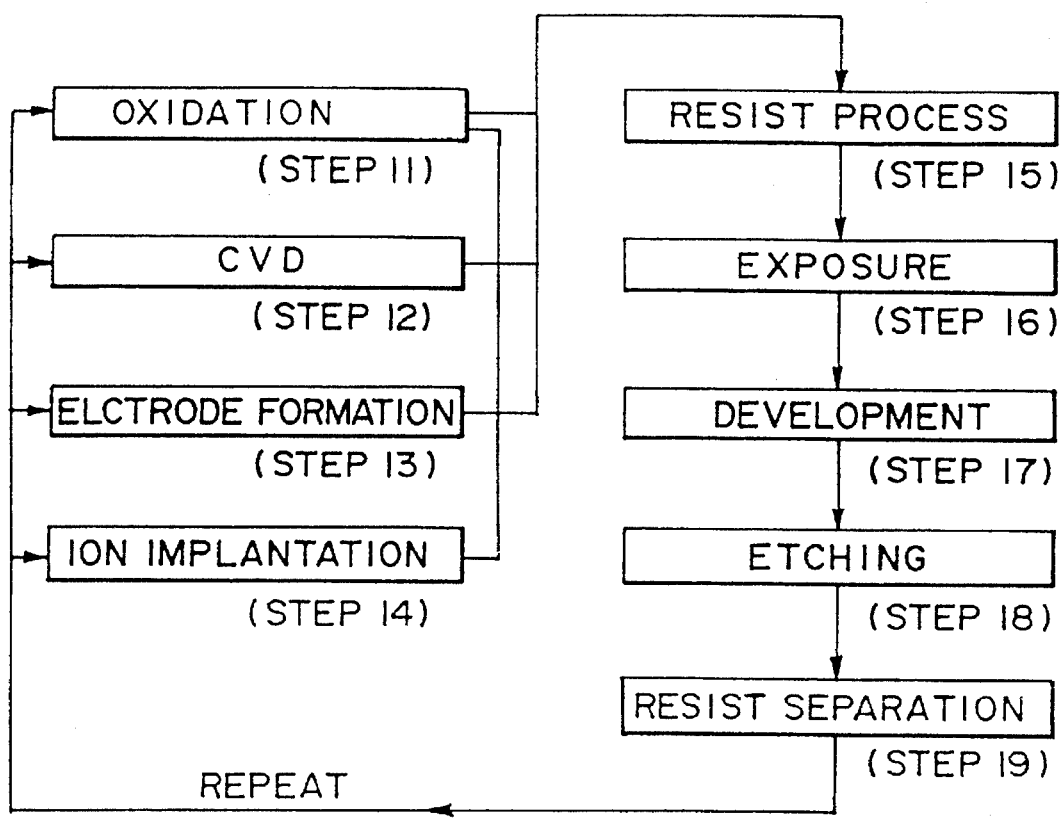
FIG. 4 is a flow chart of a wafer process.

FIG. 4 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A positioning system, comprising:

a plurality of piezoelectric actuators for moving an object to be positioned;

a plurality of current output type amplifiers for amplifying drive signals for said actuators and for producing drive currents corresponding to the drive signals;

a plurality of acceleration sensors disposed proximate to said actuators, for detecting acceleration of the object in the neighborhood of said actuators; and a feedback circuit for negatively feeding back the outputs of said acceleration sensors to input sides of said amplifiers, such that said actuators are driven in response to the drive currents.

2. A system according to claim 1, further comprising lowpass filters each having a predetermined time constant end a predetermined gain, and each being provided between a corresponding acceleration sensor and a corresponding amplifier.

3. A system according to claim 1, wherein said actuators are operable to position the object with a freedom of translation and freedoms of rotation.

4. A system according to claim 1, wherein the number of said actuators is three.

5. A system according to claim 1, wherein the object comprises a movable stage.

6. A system according to claim 5, wherein the movable stage is adapted to carry thereon a wafer.

7. A system according to claim 1, further comprising a plurality of position sensors disposed proximate to said actuators, for detecting the position of the object proximate to said actuators.

8. A system according to claim 7, further comprising an additional feedback circuit for feeding back outputs of said position sensors to drive said actuators.

9. A positioning system, comprising:

a plurality of piezoelectric actuators for moving an object to be positioned;

a plurality of sensors for detecting the position of the object in the neighborhood of said actuators; and a plurality of sensors disposed proximate to said actuators, for detecting the positional information of the object in the neighborhood of said actuators;

wherein said actuators are disposed so that their driving points are at the center of percussion of the object.

10. A system according to claim 9, wherein said actuators are operable to position the object with a freedom of translation and freedoms of rotation.

11. A system according to claim 9, wherein the number of said actuators is three.

12. A system according to claim 9, wherein the object comprises a movable stage.

13. A system according to claim 12, wherein the movable stage is adapted to carry thereon a wafer.

14. A positioning system, comprising:

first, second and third piezoelectric actuators for moving an object to be positioned;

a plurality of sensors for detecting the position of the object in the neighborhood of said three actuators; and a plurality of sensors disposed proximate to said actuators, for detecting the acceleration information of the object in the neighborhood of said three actuators;

wherein said three actuators are disposed so that their driving points are at the center of percussion of the object, wherein said three actuators are disposed substantially concentrically along a circle about a principal axis of inertia of the object, and wherein the following relations are satisfied:

$$l_d = [(J_x + J_y)/m]^{1/2}$$

$$\theta_d = \sin^{-1} [J_x/(J_x + J_y)]$$

where m is the mass of the object, $l_d$ is the radius of the circle, Jx and Jy are moments of inertia of the object about and y axes, respectively, of x-y coordinates defined along the plane of the object with its origin being defined on the principal axis, wherein one of said actuators is disposed at coordinates $(0, l_d)$, and wherein the remaining two actuators are disposed in the third and fourth quadrants of the x-y coordinates substantially at the positions of an angle $\theta_d$ with respect to the x axis.

15. A positioning system, comprising:

a plurality of piezoelectric actuators for moving an object to be positioned;

a plurality of amplifiers for amplifying drive signals and for driving said actuators;

a plurality of acceleration sensors disposed proximate to said actuators, for detecting acceleration of the object proximate to said actuators; and a feedback circuit for feeding back the outputs of said acceleration sensors to input sides of said amplifiers.

16. A positioning system according to claim 15, further comprising lowpass filters each having a predetermined time constant and a predetermined gain, and each being provided between a corresponding acceleration sensor and a corresponding amplifier.

17. A positioning system according to claim 15, wherein said actuators are operable to position the object with a freedom of translation and freedoms of rotation.

18. A positioning system according to claim 15, wherein the number of said actuators is three.

19. A positioning system according to claim 15, wherein the object comprises a movable stage.

20. A positioning system according to claim 19, wherein the movable stage is adapted to carry thereon a wafer.

21. A system according to claim 15, further comprising a plurality of position sensors disposed proximate to said actuators, for detecting the position of the object proximate to said actuators.

22. A system according to claim 21, further comprising an additional feedback circuit for feeding back outputs of said position sensors to drive said actuators.

* * * * *

UNITED STATES PATENT AND TRADEMARK OFFICE
CERTIFICATE OF CORRECTION

PATENT NO. : 5,545,962  
DATED : August 13, 1996  
INVENTOR(S) : Wakui

It is certified that error appears in the above-indentified patent and that said Letters Patent is hereby corrected as shown below:

COLUMN 2:

Line 48, "beset" should read --base;--.

COLUMN 3:

Line 36, "ant" should read --and--.

COLUMN 7:

Line 1, "$T_o=(M/K)^{1/2+cc}$" should read --$T_o=(M/K)^{1/2}$--.
Line 2, "$\zeta_o=D/2(MK)^{+c,fra\ 1/2}$" should read --$\zeta_o=D/2(MK)^{1/2}$--.
Line 19, "$X/V=K_I(1+2\zeta_o T_o X)/[s\{1+(2\zeta_o T_o+K_A K_I)s+T_o^2 s^2\}]$" should read --$X/V=K_I(1+2\zeta_o T_o s)/[s\{1+(2\zeta_o T_o+K_A K_I)s+T_o^2 s^2\}]$--.

COLUMN 10:

Line 47, "pro-stage" should read --pre-stage--.
Line 67, "base 10" should read --base 1,--.

COLUMN 13:

Line 60, "ant" should read --and--.

COLUMN 14:

Line 43, "end" should read --and--.

UNITED STATES PATENT AND TRADEMARK OFFICE
CERTIFICATE OF CORRECTION

PATENT NO. : 5,545,962
DATED : August 13, 1996
INVENTOR(S) : Wakui

It is certified that error appears in the above-indentified patent and that said Letters Patent is hereby corrected as shown below:

COLUMN 15:

Line 2, "positional" should read --acceleration--.
Line 37, "about" should read --about x--.

Signed and Sealed this

Twenty-ninth Day of April, 1997

Attest:

BRUCE LEHMAN

Attesting Officer

Commissioner of Patents and Trademarks